(12) United States Patent
Kitano et al.

(10) Patent No.: US 8,476,532 B2
(45) Date of Patent: Jul. 2, 2013

(54) MULTILAYER FLEXIBLE PRINTED CIRCUIT BOARD AND ELECTRONIC DEVICE

(75) Inventors: Naofumi Kitano, Osaka (JP); Tetsuya Esaki, Osaka (JP)

(73) Assignee: Panasonic Corporation, Osaka (JP)

( * ) Notice: Subject to any disclaimer, the term of this patent is extended or adjusted under 35 U.S.C. 154(b) by 27 days.

(21) Appl. No.: 13/272,877

(22) Filed: Oct. 13, 2011

(65) Prior Publication Data
US 2012/0092838 A1 Apr. 19, 2012

(30) Foreign Application Priority Data

Oct. 14, 2010 (JP) ................................. 2010-231664

(51) Int. Cl.
*H05K 1/00* (2006.01)

(52) U.S. Cl.
USPC ........... 174/254; 174/260; 174/261; 174/262; 174/268; 174/359; 174/363; 361/752; 361/679.01; 361/679.38; 361/749; 257/688

(58) Field of Classification Search
USPC .. 174/254, 260–262, 268, 359, 363; 361/334, 361/679.01, 679.38, 749, 752; 257/688
See application file for complete search history.

(56) References Cited

U.S. PATENT DOCUMENTS

| | | | | |
|---|---|---|---|---|
| 4,979,787 A | * | 12/1990 | Lichtenberger | 385/88 |
| 4,990,724 A | * | 2/1991 | Suppelsa et al. | 174/261 |
| 5,391,874 A | * | 2/1995 | Ellis | 250/336.1 |
| 5,680,191 A | * | 10/1997 | Voisin et al. | 349/150 |
| 5,737,053 A | * | 4/1998 | Yomogihara et al. | 349/149 |
| 5,740,261 A | * | 4/1998 | Loeppert et al. | 381/355 |
| 5,838,412 A | * | 11/1998 | Ueda et al. | 349/150 |
| 5,865,163 A | * | 2/1999 | Wildes et al. | 125/16.02 |
| 6,255,582 B1 | * | 7/2001 | Miller et al. | 174/359 |
| 6,985,659 B2 | * | 1/2006 | Torigoe et al. | 385/114 |
| 7,439,449 B1 | * | 10/2008 | Kumar et al. | 174/254 |
| 8,072,765 B2 | * | 12/2011 | Yumoto et al. | 361/749 |
| 2001/0004347 A1 | * | 6/2001 | Koga et al. | 369/116 |
| 2004/0008982 A1 | * | 1/2004 | Matsuo et al. | 396/89 |
| 2005/0018409 A1 | * | 1/2005 | Hirakata | 361/752 |
| 2005/0175299 A1 | * | 8/2005 | Hargis et al. | 385/93 |
| 2005/0183101 A1 | * | 8/2005 | Li et al. | 720/601 |
| 2005/0245103 A1 | * | 11/2005 | Ellison | 439/61 |
| 2006/0027909 A1 | * | 2/2006 | Kobayashi | 257/688 |
| 2006/0032665 A1 | * | 2/2006 | Ice | 174/254 |
| 2006/0244114 A1 | * | 11/2006 | Goodwin | 257/678 |
| 2007/0085452 A1 | * | 4/2007 | Coleman | 310/334 |
| 2008/0080125 A1 | * | 4/2008 | Chikazawa et al. | 361/680 |
| 2008/0164055 A1 | * | 7/2008 | Wang et al. | 174/260 |
| 2008/0316116 A1 | * | 12/2008 | Hobson et al. | 343/702 |

(Continued)

FOREIGN PATENT DOCUMENTS

JP 9-251813 9/1997

*Primary Examiner* — Xiaoliang Chen
(74) *Attorney, Agent, or Firm* — Hamre, Schumann, Mueller & Larson, P.C.

(57) ABSTRACT

A multilayer flexible printed circuit board disclosed in the present application is a multilayer flexible printed circuit board in which a ground layer, an insulating layer and a signal wiring layer in which signal wiring is formed are laminated in sequence, with the multilayer flexible printed circuit board including a protruding portion protruding laterally, and a ground that is electrically connected to the ground layer being formed on at least one surface of the protruding portion, in order to have shielding properties that can cope with high speed signal transmission performed via the signal wiring layer.

3 Claims, 7 Drawing Sheets

U.S. PATENT DOCUMENTS

| | | | |
|---|---|---|---|
| 2009/0256759 A1* | 10/2009 | Hill et al. | 343/702 |
| 2010/0226103 A1* | 9/2010 | Muro et al. | 361/749 |
| 2011/0003622 A1* | 1/2011 | Hwang | 455/575.1 |
| 2011/0038128 A1* | 2/2011 | Kitagawa et al. | 361/749 |
| 2011/0120770 A1* | 5/2011 | Yokonuma | 174/94 S |
| 2011/0140932 A1* | 6/2011 | Chen | 341/22 |
| 2011/0181003 A1* | 7/2011 | Hayashi et al. | 277/630 |
| 2011/0230146 A1* | 9/2011 | Morishita et al. | 455/77 |
| 2012/0009983 A1* | 1/2012 | Mow et al. | 455/575.7 |
| 2012/0050114 A1* | 3/2012 | Li et al. | 343/702 |
| 2012/0087065 A1* | 4/2012 | Kim et al. | 361/679.01 |

* cited by examiner

MULTILAYER FLEXIBLE PRINTED CIRCUIT BOARD AND ELECTRONIC DEVICE

BACKGROUND OF THE INVENTION

1. Field of the Invention

The present invention relates to a multilayer flexible printed circuit board that is connected to a circuit substrate and a device to transmit signals, and an electronic device including such a multilayer flexible printed circuit board, and particularly to a multilayer flexible printed circuit board that can provide a high shielding effect for transmitted signals and an electronic device including such a multilayer flexible printed circuit board.

2. Description of Related Art

Flexible printed circuit (FPC) boards are used to connect circuit substrates or to connect a circuit substrate and a device such as a disk drive, display panel or memory device. The flexible printed circuit boards include a laminate in which a conductor layer made of a patterned copper foil or the like is laminated on a base material made of an insulating resin such as polyimide. In recent years, in order to handle the increased types of signals transmitted via the flexible printed circuit board and the miniaturization of devices in which the flexible printed circuit board is used, multilayer flexible printed circuit boards including a plurality of conductor layers laminated with insulating layers interposed therebetween have also been widely used.

With such a multilayer flexible printed circuit board, a technique has been used in which, rather than using one of the conductor layers as a wiring layer for transmitting signals, a pattern is formed in a planar form to have the same potential and the layer is used as a ground layer having the ground potential, and thereby a shielding effect that prevents the influence of noise on the transmission signals transmitted via the flexible printed circuit board can be obtained.

FIG. 7 shows an example of a conventional multilayer flexible printed circuit board disclosed in JP H9-251813A.

In a cable 500 for transmitting record and playback signals that is a conventional multilayer flexible printed circuit board shown in FIG. 7, a shielding member 502 serving as a conductor pattern is formed on a resin base member 501, and signal wiring 504 is formed on the shielding member 502 via an insulating layer 503 made of an insulating member. By grounding the shielding member 502, the conductor layer is caused to exhibit a mirror image effect, and the inductance of the signal wiring 504 as a round-trip signal line is reduced, so as to achieve a higher data transfer speed and reliable transmission of high frequency signal components.

By providing a conductor layer in a multilayer flexible printed circuit board and grounding it to form a ground layer as described in the technique disclosed in the patent document mentioned above, it is possible to obtain the effect as a shielding layer of the signal wiring disposed in the signal wiring layer of the multilayer flexible printed circuit board.

However, in order to obtain sufficient shielding effects for the signals transmitted via the signal wiring formed in the signal wiring layer of the multilayer flexible printed circuit board, it is important to ground the potential of the ground layer reliably to the ground potential (0 V). In other words, it is necessary to configure a multilayer flexible printed circuit board that is inherently capable of deformation such that the potential of the ground layer does not vary and is always maintained at the ground potential (0 V) even if the multilayer flexible printed circuit board is deformed.

SUMMARY OF THE INVENTION

The present invention has been conceived to solve the problems described above, and it is an object of the present invention to provide a multilayer flexible printed circuit board having shielding properties that can cope with high speed signal transmission performed via the signal wiring layer, and an electronic device using such a multilayer flexible printed circuit board and having a high level of operational reliability.

In order to solve the above-described problems, a multilayer flexible printed circuit board according to the present invention is a multilayer flexible printed circuit board in which a ground layer, an insulating layer and a signal wiring layer in which signal wiring is formed are laminated in sequence, wherein the multilayer flexible printed circuit board includes a protruding portion protruding laterally, and a ground that is electrically connected to the ground layer is formed on at least one surface of the protruding portion.

Also, an electronic device according to the present invention is an electronic device including: a housing, at least a portion of which is conductive; a circuit substrate housed in the housing; and the multilayer flexible printed circuit board according to the present invention connected to a connector portion of the circuit substrate, wherein the ground formed in the protruding portion of the multilayer flexible printed circuit board is electrically connected to the conductive portion of the housing.

With the multilayer flexible printed circuit board of the present invention, even if there is a change in shape, the ground layer can be connected reliably to the ground potential by using the ground formed in the protruding portion. Accordingly, the potential of the ground layer can be stabilized, and a reliable shielding effect for the signals transmitted via the signal wiring layer can be obtained.

Also, with the electronic device of the present invention, the ground formed in the protruding portion of the multilayer flexible printed circuit board can be connected to the conductive portion of the housing, and thus the ground layer can be reliably set to the ground potential, reliable shielding effects for the signals transmitted via the multilayer flexible printed circuit board are exhibited, and an electronic device having a high level of operational reliability can be obtained.

DETAILED DESCRIPTION OF THE INVENTION

Figure 1:
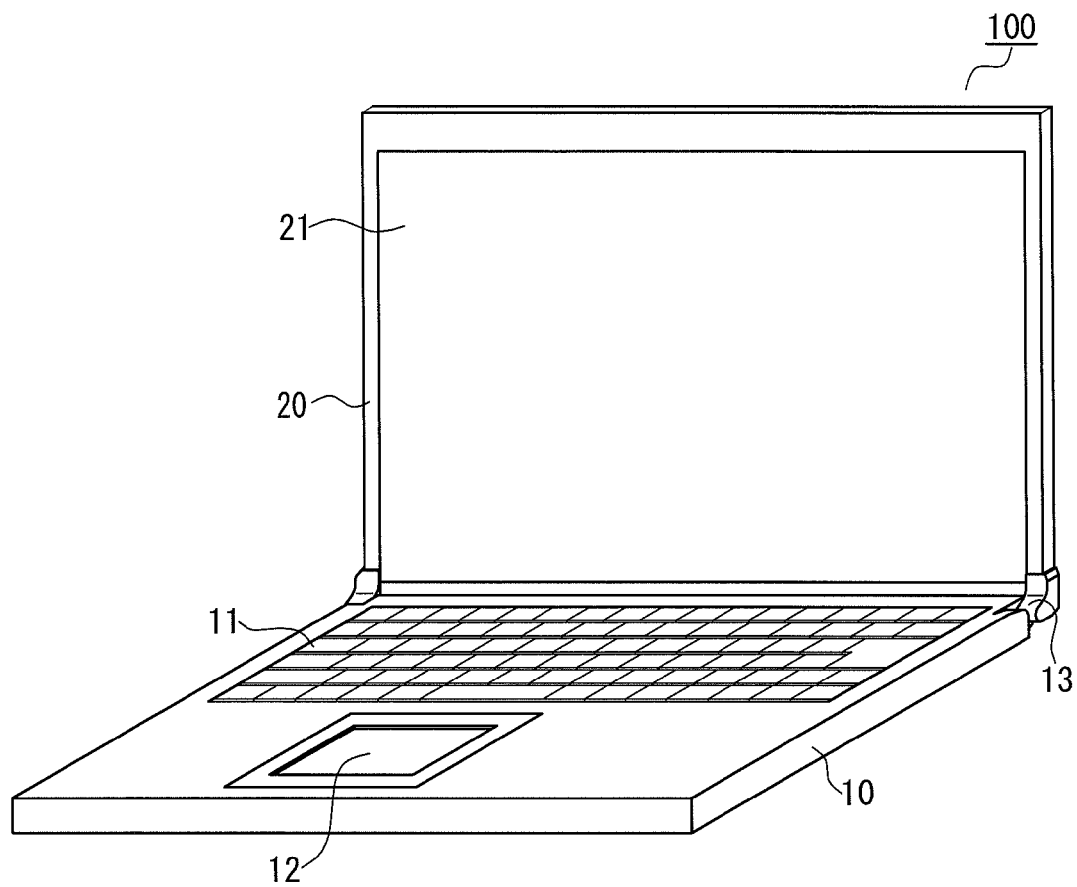
FIG. 1 is a perspective view showing the overall configuration of a notebook computer according to an embodiment of the present invention.

A multilayer flexible printed circuit board disclosed in the present application is a multilayer flexible printed circuit board in which a ground layer, an insulating layer and a signal wiring layer in which signal wiring is formed are laminated in sequence, wherein the multilayer flexible printed circuit board includes a protruding portion protruding laterally, and a ground that is electrically connected to the ground layer is formed on at least one surface of the protruding portion.

With this configuration, the ground layer can be connected reliably to the ground potential by using the ground formed in the protruding portion protruding laterally from the multilayer flexible printed circuit board and electrically connected to the ground layer. Accordingly, even if the multilayer flexible printed circuit board is deformed, the potential of the ground layer can be maintained at the ground potential in a stable manner, and reliable shielding effects for the signals transmitted via the signal wiring layer can be obtained.

In the multilayer flexible printed circuit board disclosed in the present application, it is preferable that the ground is formed by the ground layer that protrudes at the protruding portion. With this configuration, by connecting the ground to the ground potential such as the inner surface of the housing, the ground layer can be maintained reliably at the ground potential.

Also, it is preferable that a surface of the protruding portion opposite to the protruding ground layer serves as a ground made of a conductive material constituting the signal wiring layer. With this configuration, it is possible to easily form grounds on the opposite surfaces of the protruding portion.

Furthermore, it is preferable that a plurality of protruding portions are formed at positions different from a routing direction of the signal wiring, and protruding directions of at least one pair of adjacent protruding portions out of the plurality of protruding portions are opposite. With this configuration, the protruding portions of the ground layer protrude on both sides of the multilayer flexible printed circuit board, and it is therefore possible to easily electrically connect the ground layer and the ground potential portion such as the inner surface of the housing.

An electronic device disclosed in the present application includes: a housing at least a portion of which is conductive; a circuit substrate housed in the housing; and the multilayer flexible printed circuit board according to the present invention connected to a connector portion of the circuit substrate, wherein the ground formed in the protruding portion of the multilayer flexible printed circuit board is electrically connected to the conductive portion of the housing.

With this configuration, the ground layer of the multilayer flexible printed circuit board is connected to the conductive portion of the housing by the ground formed in the protruding portion. Accordingly, the ground layer can be reliably set to the ground potential, and it is therefore possible to obtain reliable shielding effects for transmitted signals even if the multilayer flexible printed circuit board is deformed and to obtain an electronic device having a high level of operational reliability.

Also, it is preferable that the multilayer flexible printed circuit board is disposed in the housing such that the signal wiring layer is closer to an inner surface of the housing than the ground layer is. By disposing the multilayer flexible printed circuit board in this manner, the signal wiring is sandwiched between the ground layer and the conductive portion of the housing, and it is therefore possible to effectively prevent the influence of external noise on the signals transmitted via the signal wiring.

Furthermore, it is preferable that a signal wiring layer-side surface of the protruding portion is covered with an insulating material, the ground formed on the surface different from the signal wiring layer-side surface of the protruding portion and the conductive portion of the housing are electrically connected with a conductive tape, and the multilayer flexible printed circuit board is fixedly attached to the inner surface of the housing by the conductive tape. With this configuration, a route for electrically connecting the ground formed in the protruding portion and the conductive inner surface of the housing can be formed reliably via the conductive tape, and even in an electronic device whose orientation is changed during operation such as a mobile device, the influence of noise on transmitted signals can be reduced and a high level of reliability can be obtained.

Hereinafter, an electronic device in which a multilayer flexible printed circuit board disclosed in the present application is used will be described, taking a notebook computer in which a multilayer flexible printed circuit board is used to connect circuit substrates in its main body portion as an example.

FIG. 1 is a perspective view showing the external appearance of a notebook computer used as an electronic device in which a multilayer flexible printed circuit board disclosed in the present application is used.

As shown in FIG. 1, a notebook computer 100 according to an embodiment of the present invention is constituted by a main body portion 10 and a display unit 20 provided with a display panel 21. The display unit 20 is rotatably attached to the main body portion 10 by a hinge mechanism 13, and thus when the notebook computer 100 is not in use, the display unit 20 serves as a cover of the main body portion 10.

As the display panel 21 used in the display unit 20, any of various types of flat panel displays such as a liquid crystal panel or an organic or inorganic EL panel can be used. A portion that becomes the upper end of the display unit 20 when the display unit 20 is opened such that the display panel 21 can be viewed is internally provided with an antenna module (not shown) for performing wireless LAN communication.

On the surface of the main body portion 10, ordinary constituent elements of a notebook computer are provided such as a keyboard 11 and a touch pad 12, as well as various types of switches and the cover of a disk drive device that are not shown in the diagram. Also, various types of circuit substrates on which a CPU, a memory, a power supply circuit component and the like are mounted, a rechargeable battery, various types of drive devices and the like are housed in the main body portion 10. The display unit 20 and the main body portion 10 can have the same configuration as those of a conventionally known notebook computer, and therefore a detailed description thereof is not given here.

Figure 2:
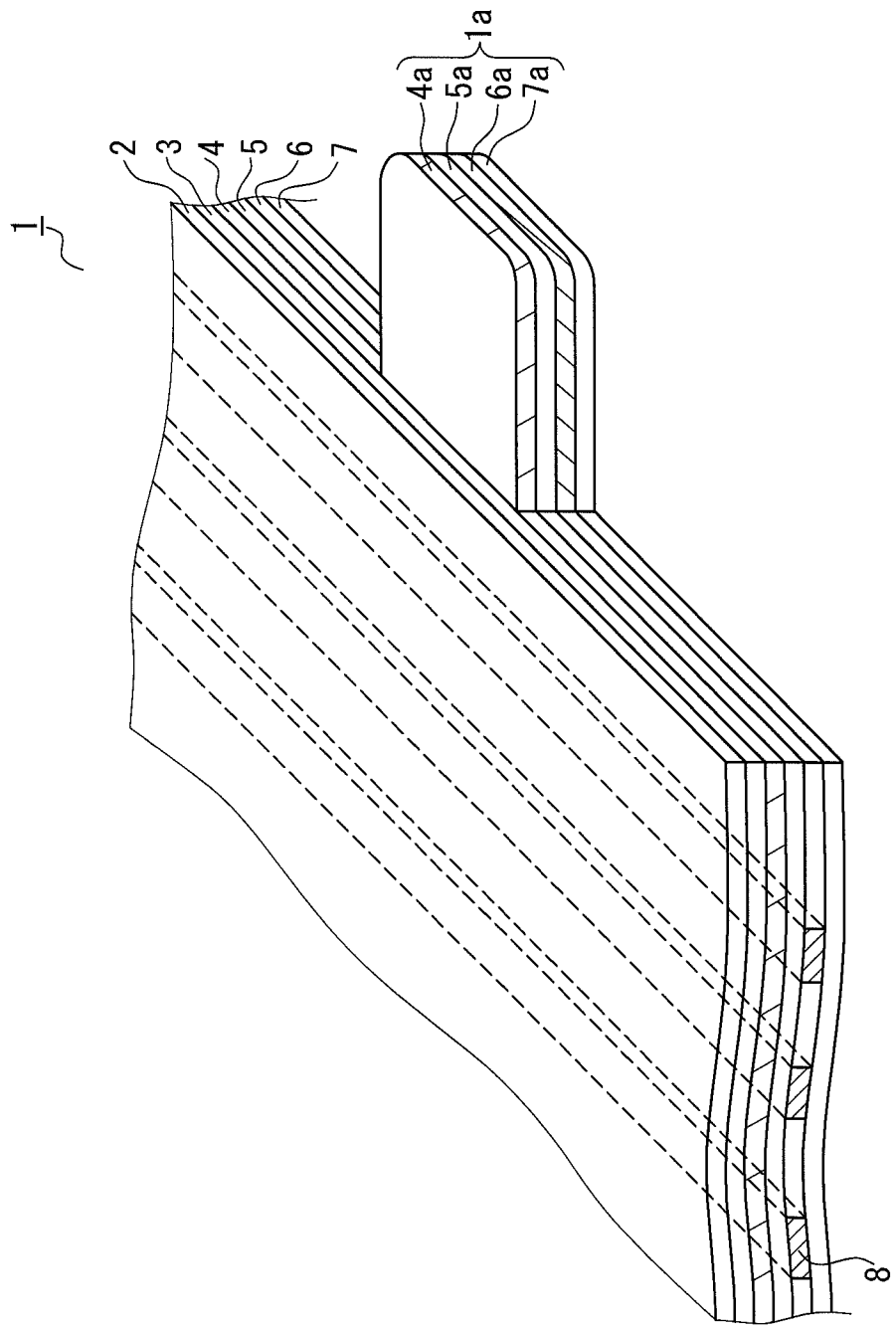
FIG. 2 is a partial cross-sectional view showing the configuration of a multilayer flexible printed circuit board according to the embodiment of the present invention.

FIG. 2 is a partially enlarged cross-sectional view for showing the configuration of a multilayer flexible printed circuit board 1 that connects circuit substrates in the main body portion 10 of the notebook computer 100 of the present embodiment.

As shown in FIG. 2, in the multilayer flexible printed circuit board 1, a ground layer 4 made of a metal foil such as copper, an insulating layer 5 made of an insulating resin such as polyimide, a signal wiring layer 6 made of a copper foil such as copper, and a surface protective layer 7 made of an insulating resin such as polyimide are laminated in sequence on a base material 3 made of an insulating resin film, such as polyimide, with its surface covered with a coverlay film 2 serving as a protective layer. Each layer generally has a thickness of approximately 10 to 50 μm, and the base material 3, the ground layer 4 and the signal wiring layer 6 are made relatively thicker than other layers. Although not shown, an adhesive layer for bonding layers having a thickness of approximately 25 μm or less is interposed between adjacent layers.

In the signal wiring layer 6, signal wiring 8 is formed by patterning a metal foil such as copper by a known method such as etching.

A protruding portion 1a is formed on a side of the multilayer flexible printed circuit board 1, specifically, formed outwardly in a direction substantially orthogonal to the extension direction of the signal wiring 8. The protruding portion 1a of the multilayer flexible printed circuit board 1 of the present embodiment is constituted by a protruding pattern 4a of the ground layer 4, a protruding pattern 5a of the insulating layer 5, a protruding pattern 6a of the signal wiring layer 6, and a protruding pattern 7a of the surface protective layer 7 that are formed to have the same shape in the ground layer 4, the insulating layer 5, the signal wiring layer 6 and the surface protective layer 7, respectively. The coverlay film 2 and the base material 3 have no protruding patterns formed therein, and thus the protruding pattern 4a of the ground layer 4 is exposed at the surface of the protruding portion 1a that is different from the side on which there is the signal wiring layer 6, thereby forming a ground.

Figure 3:
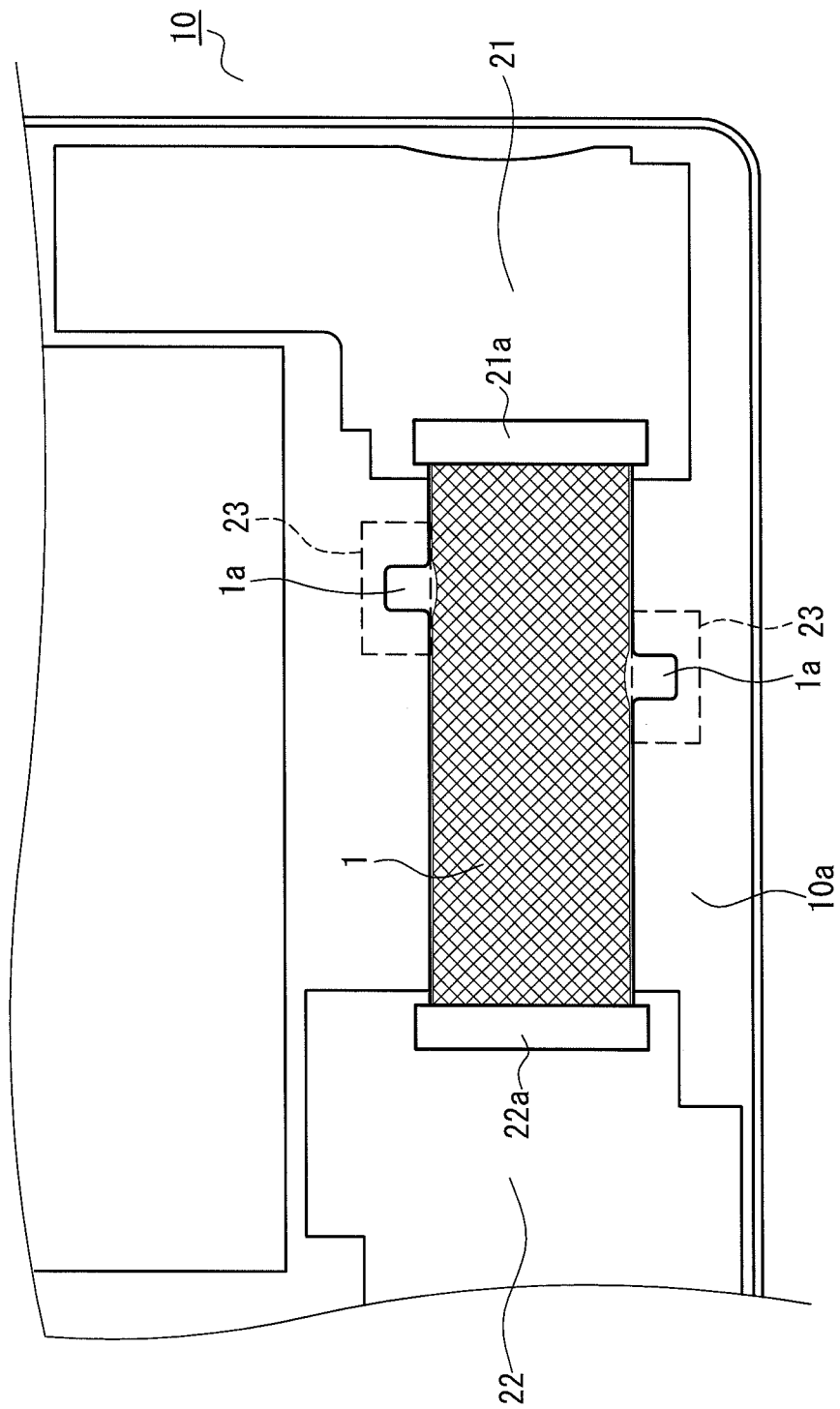
FIG. 3 is an enlarged plan view showing a state of the multilayer flexible printed circuit board disposed in a housing of the notebook computer according to the embodiment of the present invention.

FIG. 3 is a plan view showing the internal structure of the main body portion 10 of the notebook computer 100 of the present embodiment.

FIG. 3 shows a state in which an upper housing constituting the main body portion 10 has been removed together with the keyboard 11, the touch pad 12 and the like disposed on the housing. As shown in FIG. 3, inside a lower housing of the main body portion 10, a first circuit substrate 21 and a second circuit substrate 22 are placed, and a connection terminal 21a of the first circuit substrate 21 and a connection terminal 22a of the second circuit substrate 22 are connected with a multilayer flexible printed circuit board 1.

In the multilayer flexible printed circuit board 1 of the notebook computer 100 of the present embodiment, a portion in which the protruding portion 1a is formed is fixedly attached to an inner surface 10a of the lower housing of the main body portion 10 with a conductive tape 23. In the multilayer flexible printed circuit board 1, two protruding portions 1a protrude in opposite directions to each other. Each protruding portion 1a is disposed such that the protruding pattern 4a of the ground layer 4 formed as a ground faces toward the surface, or in other words, such that the protruding pattern 4a is visible in FIG. 3.

With this configuration, the multilayer flexible printed circuit board 1 can be fixedly attached, with the conductive tape 23, to the inner surface 10a of the housing at two points on opposite sides in the lengthwise direction of the multilayer flexible printed circuit board 1 therefore physical attachment of the multilayer flexible printed circuit board 1 and electrical connection via the ground of the protruding portions 1a can be strengthened. Regarding the area of the conductive tape 23 covering the multilayer flexible printed circuit board 1 when the protruding portion 1a is fixedly attached to the inner surface 10a of the housing, in order to avoid interference with the signal wiring 8 due to the conductive tape 23, as shown in FIG. 3, it is preferable that the conductive tape 23 is attached only to the protruding portion 1a without covering the signal wiring 8 of the flexible printed circuit board 1, if possible. In FIG. 3, in order to clearly show the multilayer flexible printed circuit board 1 and the protruding portions 1a, the conductive tape 23 is indicated by dotted lines.

Figure 4:
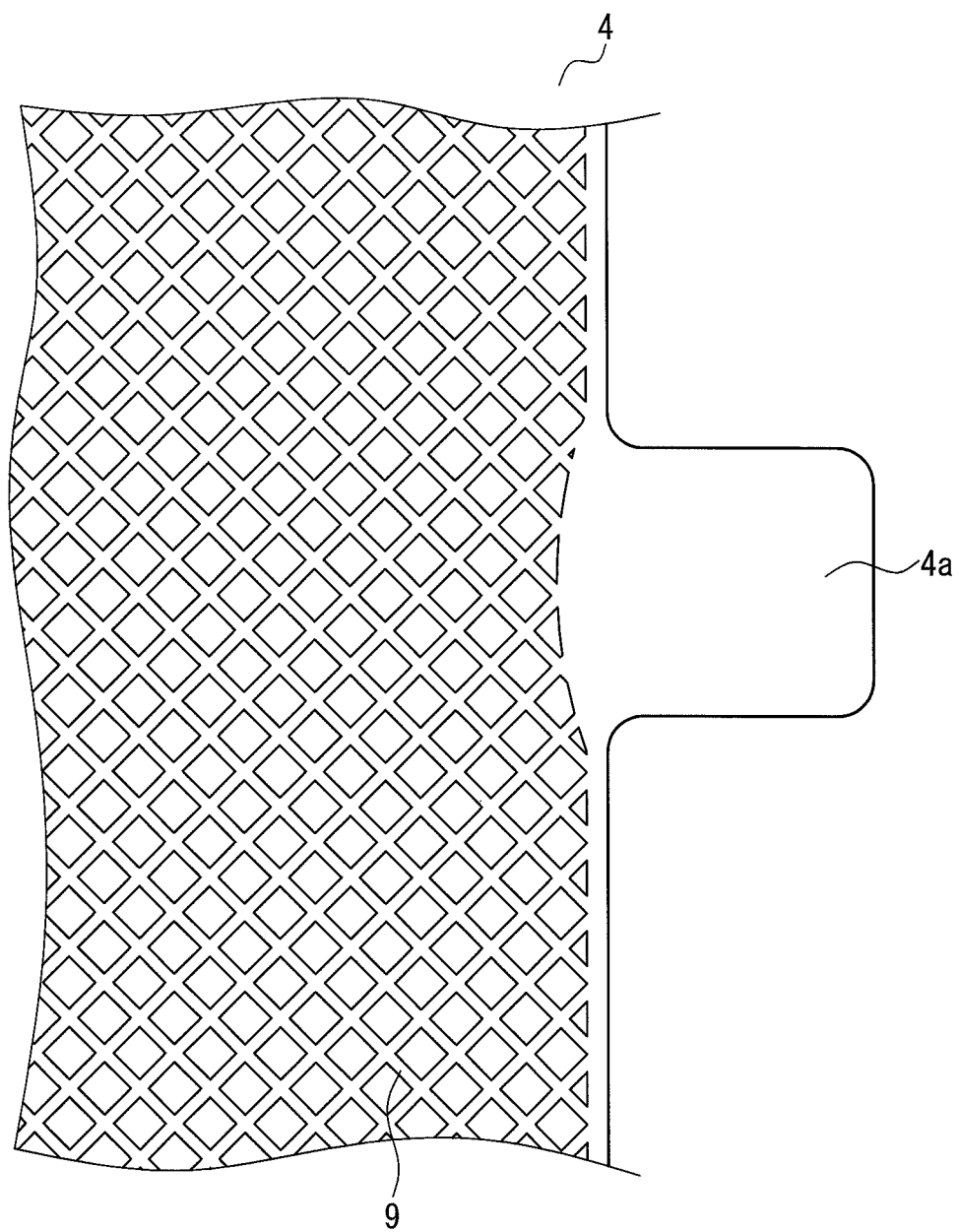
FIG. 4 is an enlarged plan view of a relevant part showing the configuration of a ground formed in a ground layer of the multilayer flexible printed circuit board of the embodiment of the present invention.

As shown in FIG. 4, the ground layer 4 of the multilayer flexible printed circuit board 1 of the present embodiment has a diagonal grid pattern 9 formed by etching a copper foil. By forming the ground layer 4 in a grid shape as described above, the rigidity of the multilayer flexible printed circuit board 1 can be reduced as compared to the case where the ground layer is made of a planar copper foil layer, making it easy to curve or bend the multilayer flexible printed circuit board 1 at a desired position. Also, since the copper foil material used as the ground layer 4 is reduced, a weight reduction can be achieved.

As shown in FIG. 4, the protruding pattern 4a serving as a ground formed in the ground layer 4 is formed integrally with the diagonal grid pattern 9 of the ground layer 4. The protruding pattern 4a can be formed simultaneously when the pattern of the ground layer 4 is formed, by adding a pattern shape of the protruding pattern 4a to a mask used to etch the ground layer 4 into a grid shape.

It is preferable to set the size of the protruding pattern 4a as appropriate according to the size of the multilayer flexible printed circuit board 1 and the connecting method of the protruding pattern 4a serving as a ground to the conductive portion of the inner surface of the housing serving as the ground potential. In the notebook computer 100 of the present embodiment, the protruding pattern 4a serving as a ground of the protruding portion 1a and the inner surface 10a of the metal lower housing of the main body portion 10 are electrically connected by using the conductive tape 23, and thus the protruding pattern 4a is formed in a substantially square shape having a size of approximately 7 mm by 7 mm.

In the multilayer flexible printed circuit board 1 of the present embodiment, the reason that the ground layer 4 is formed to have a diagonal grid pattern 9 is that it is more resistant to bending of the multilayer flexible printed circuit board 1 and the pattern of the ground layer 4 is less likely to be broken as compared to the case where the ground layer 4 is formed to have a grid shape having vertical and horizontal lines with respect to the routing direction of the signal wiring 8 of the multilayer flexible printed circuit board 1. It should be noted, however, forming the ground layer 4 in a grid pattern or a diagonal grid pattern is not necessarily required for the multilayer flexible printed circuit board 1 of the present embodiment. There is no limitation on the shape of the pattern of the ground layer 4 as long as the ground layer 4 is provided as one of the conductor layers of the multilayer flexible printed circuit board 1, a metal member is disposed at such a density to maintain the entire layer at the ground potential, and necessary strength and flexibility to adapt to changes in shape such as bending, which is required for the multilayer flexible printed circuit board 1, can be obtained.

Figure 5:
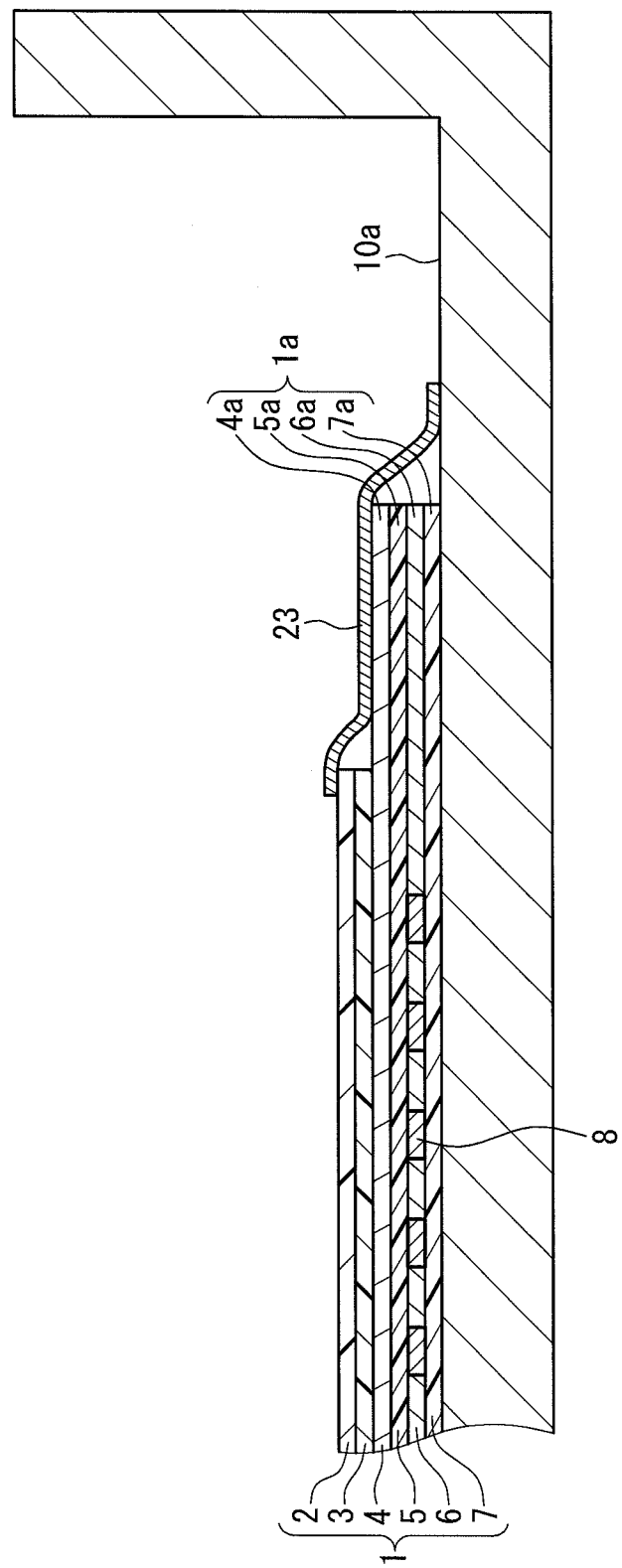
FIG. 5 is an enlarged cross-sectional view of a relevant part showing a state in which the multilayer flexible printed circuit board of the embodiment of the present invention is fixedly attached to the inner surface of the housing of the notebook computer.

FIG. 5 is an enlarged cross-sectional view of a relevant part showing a state in which the multilayer flexible printed circuit board 1 is disposed in the main body portion 10 of the notebook computer 100 and an electrical connection between the protruding pattern 4a of the ground layer 4 serving as a ground formed on the surface of the protruding portion 1a of the multilayer flexible printed circuit board 1 and the inner surface 10a of the lower housing of the main body portion 10.

As shown in FIG. 5, the multilayer flexible printed circuit board 1 is disposed such that the signal wiring layer 6 is closer to the inner surface 10a of the lower housing of the main body portion 10 than the ground layer 4 is, or in other words, such that the ground layer 4 is above the signal wiring layer 6 in FIG. 5. With this configuration, the signal wiring 8 of the signal wiring layer 6 is sandwiched between the inner surface 10a of the lower housing of the main body portion 10 and the ground layer 4, whereby it is possible to obtain a high shielding effect against unwanted emissions or the like caused in the signal wiring 8.

The conductive tape 23 can be, for example, a tape having, on one side thereof, an adhesive layer containing conductive fine powders such as a metal or carbon, and has a function of physically attaching members as an adhesive tape as well as providing electrical connection between the members. There is no particular limitation on the conductive tape used in the present embodiment, and a commercially available tape may be used.

As shown in FIG. 5, in the notebook computer 100 of the present embodiment, the conductive tape 23 is attached to the protruding portion 1a of the multilayer flexible printed circuit board 1, and thereby the protruding portion 1a is fixed to the inner surface 10a of the lower housing of the main body portion 10, and at the same time, the protruding pattern 4a of the ground layer 4 serving as a ground and exposed at the surface of the protruding portion 1a and the inner surface 10a of the housing are electrically connected.

As described above, by fixedly attaching the ground of the protruding portion 1a to the inner surface 10a of the housing with the conductive tape 23, the ground layer 4 of the multilayer flexible printed circuit board 1 can be connected to the inner surface 10a of the metal housing, with a large area and high accuracy, as compared to, for example, the case where connection is made by simply sandwiching the signal wiring 8 that is a conductor pattern of the multilayer flexible printed circuit board 1 between connection terminals such as the connection terminals 21a and 22a for connecting the signal wiring 8 of the signal wiring layer 6 to the circuit substrates 21 and 22.

The protruding portion 1a does not necessarily include the protruding pattern 7a of the surface protective layer 7, the protruding pattern 6a of the signal wiring layer 6 and the like as long as it includes the protruding pattern 4a connected to the ground layer 4 on the surface thereof. However, in the present embodiment, the protruding pattern 4a of the ground layer 4, the protruding pattern 5a of the insulating layer 5, the protruding pattern 6a of the signal wiring layer 6 and the protruding pattern 7a of the surface protective layer 7 of the protruding portion 1a, which are disposed on the inner surface 10a of the housing, are configured to have the same configuration as that of the multilayer flexible printed circuit board 1 because by configuring the protruding portion 1a to be as flat as possible to the inner surface 10a, conduction can be further ensured and attachment of the flexible printed circuit board 1 to the inner surface 10a can be strengthened when the protruding pattern 4a of the ground layer 4 is electrically connected to the inner surface 10a of the housing of the main body portion by the conductive tape 23.

Also, in the notebook computer 100 of the present embodiment, because the protruding portion 1a of the multilayer flexible printed circuit board 1 including the signal wiring 8 is connected to the inner surface 10a of the housing by the conductive tape 23, even in the notebook computer 100 whose orientation is changed during operation or to which vibration or impact is easily applied when it is carried, the multilayer flexible printed circuit board 1 itself is fixed in the housing, and at the same time, the ground layer 4 of the multilayer flexible printed circuit board 1 can be maintained at the ground potential with reliability. Accordingly, it is possible to obtain a highly reliable notebook computer 100 with a stable operation that can exert a high shielding effect of the ground layer 4 for the signal wiring 8 with which high speed signal transmission is performed.

Furthermore, the ground layer 4 that is one of the conductor layers of the multilayer flexible printed circuit board 1 can be used as a shielding layer, and it is therefore possible to obtain a shielding layer at lower cost than that in the case of forming a conductive coating film on the surface of the base material of the multilayer flexible printed circuit board 1, and the flexibility of the multilayer flexible printed circuit board 1 will not be compromised.

As shown in FIG. 5, the conductive tape 23 is disposed such that its end slightly covers the periphery beside the multilayer flexible printed circuit board 1 so as to cover the protruding portion 1a of the multilayer flexible printed circuit board 1 but not to cover a portion in which the signal wiring 8 of the multilayer flexible printed circuit board 1 is formed. This is because there is a possibility that, if the conductive tape 23 serving as the ground potential partially covers the signal wiring 8 of the signal wiring layer 6, a difference might occur in the reference potential between the portion covered by the conductive tape 23 and the portion not covered by the conductive tape 23, degrading the characteristics of the signals transmitted via the signal wiring 8. Accordingly, the area of the conductive tape 23 that covers the main body portion other than the protruding portion 1a of the multilayer flexible printed circuit board 1 is set as appropriate such that the transmitted signals are not affected and the multilayer flexible printed circuit board 1 can be physically attached.

Next, a variation of the multilayer flexible printed circuit board used in the notebook computer 100 of the present embodiment will be described with reference to FIG. 6.

Figure 6:
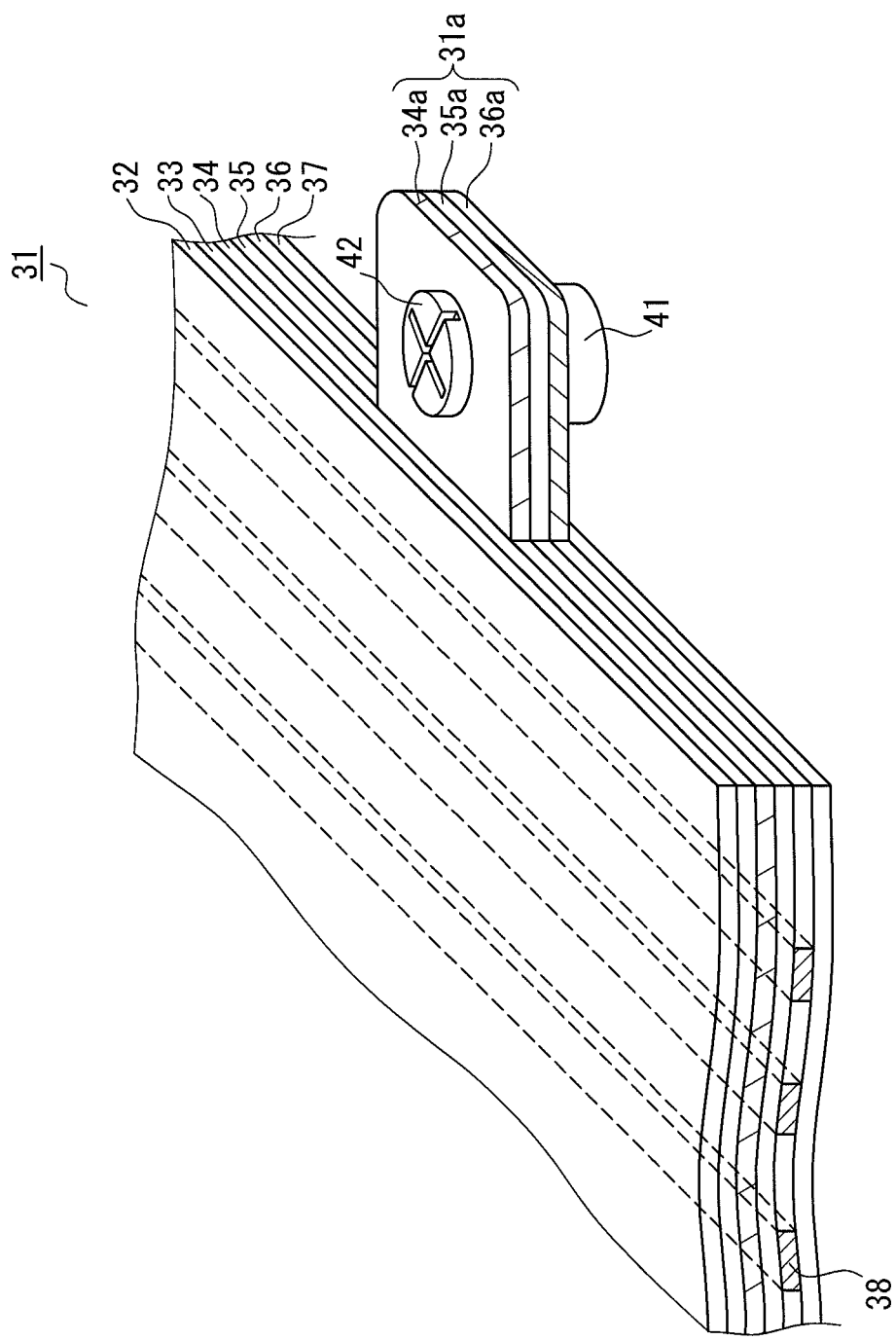
FIG. 6 is a partial cross-sectional view showing the configuration of a variation of the multilayer flexible printed circuit board according to the embodiment of the present invention.
Figure 7:
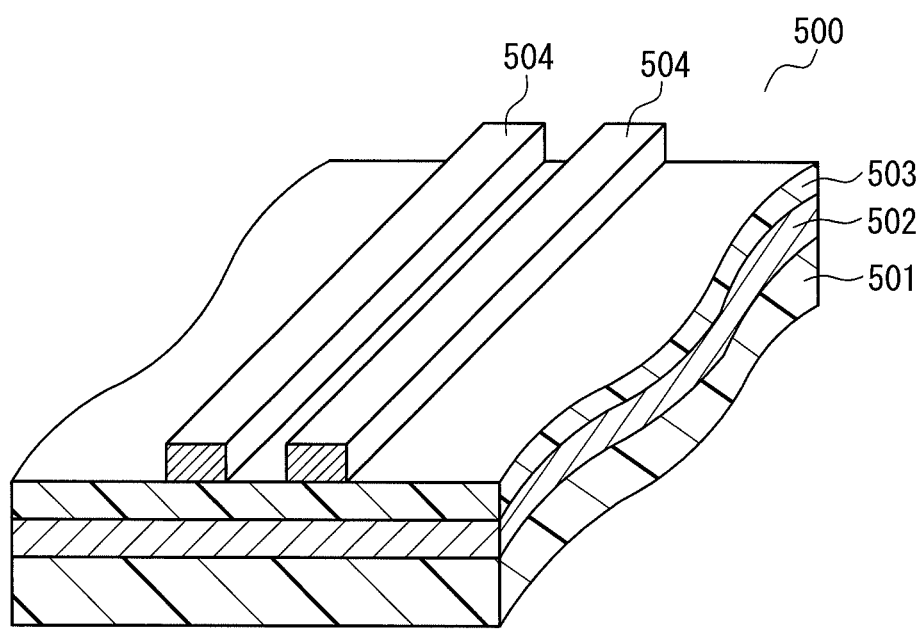
FIG. 7 is a partial cross-sectional view showing the configuration of a conventional multilayer flexible printed circuit board.

In a multilayer flexible printed circuit board 31 according to a variation shown in FIG. 6, a protruding portion 31a protruding laterally is constituted by a protruding pattern 34a of a ground layer 34, a protruding pattern 35a of an insulating layer 35 and a protruding pattern 36a of a signal wiring layer 36. A surface protective layer 37 has no protruding pattern as with a coverlay film 32 and a base material 33.

In the multilayer flexible printed circuit board 31 of the variation, the protruding pattern 36a of the signal wiring layer 36 is also electrically connected to the ground layer 34, and thus the protruding pattern 34a of the ground layer 34 and the protruding pattern 36a of the signal wiring layer 36 together form a ground.

With this configuration, when the protruding portion 31a is fixedly attached to the inner surface 10a of the housing with a fixing screw 42, not only is the protruding pattern 34a of the ground layer 34 connected to the ground potential via the metal screw 42, but also the protruding pattern 36a of the signal wiring layer 36 on the underside of the protruding portion 31a can be brought into direct contact with a screw receiving portion 41 formed in the housing. Accordingly, the ground layer 34 can be connected to the ground potential more reliably by using the protruding pattern 34a of the ground layer 34 and the protruding pattern 36a of the signal wiring layer 36 that serve as a connecting portion formed in the protruding portion 31a.

In the case where the multilayer flexible printed circuit board 31 is fixed with screws, however, the protruding portion 31a of the multilayer flexible printed circuit board 31 and the screw receiving portion 41 formed in the inner surface of the main body portion need to be positioned relative to each other with high accuracy.

As described above, in the notebook computer 100 of the present embodiment, the ground layer 4 or 34 of the multilayer flexible printed circuit board 1 or 31 that transmits signals between the circuit substrates 21 and 22 is connected to the inner surface 10a of the lower housing of the metal main body portion 10 via the ground 4a or the grounds 34a and 36a of the protruding portion 1a or 31a formed in the multilayer flexible printed circuit board 1 or 31. Accordingly, even with the notebook computer 100 to which external vibration or impact is often applied when it is in use or carried, a high shielding effect for high speed signal transmission can be obtained, and the operational reliability of the notebook computer 100 can be improved.

Also, in the present embodiment, a configuration has been described in which the protruding pattern 34a of the ground layer 34 and the protruding pattern 36a of the signal wiring layer 36 are electrically connected by fixing the protruding portion 31a to the screw receiving portion 41 formed in the housing with the screw 42, but the method of electrically connecting the protruding pattern 34a and the protruding pattern 36a may be, for example, a method in which a through hole or the like having an inner wall plated with a conductive material is formed in the protruding pattern 35a of the insulating layer 35. With this configuration, for example, instead of the configuration as described with reference to FIG. 5 in which the ground layer 4 of the multilayer flexible printed circuit board and the inner surface 10a of the housing of the main body portion 10 are connected by using the conductive tape 23, by fixedly attaching the protruding portion 31a by using an electrically insulating tape that is generally less expensive than the conductive tape 23, the protruding pattern 36a of the signal wiring layer 36 and the inner surface 10a of the housing of the main body portion 10 facing each other can be connected, and the inner surface 10a of the housing and the ground layer 4 can be electrically connected via the through hole plated with a conductive material and formed in the protruding pattern 35a of the insulating layer 35.

In the multilayer flexible printed circuit board of the present embodiment, the number of protruding portions is not limited to two as shown in FIG. 3, and the number of protruding portions can be one or three or more according to the length and shape of the multilayer flexible printed circuit board. Also, the directions in which the plurality of protruding portions protrude are not limited to those as shown in FIG. 3 in which adjacent protruding portions protrude in opposite directions. The protruding directions of the protruding portions can be designed as appropriate according to the fixed positions of the protruding portions that are defined according to the available space in the main body portion in which the multilayer flexible printed circuit board is disposed.

Furthermore, the present embodiment has been described taking a linear multilayer flexible printed circuit board as an example, but it is possible to use a multilayer flexible printed circuit board of any shape such as a multilayer flexible printed circuit board in which the routing direction of the signal wiring is bent or curved. Particularly in the case where the routing direction of the signal wiring of a multilayer flexible printed circuit board is bent or curved, instead of causing the protruding portions to protrude in a direction vertical to the routing direction of the signal wiring as shown in FIGS. 2 and 3, it is preferable to cause the protruding portions to protrude in a direction that is desirable to fixedly attach the multilayer flexible printed circuit board and establish electrical connection and that does not interfere with the signals transmitted via the signal wiring.

Furthermore, the present embodiment has been described using an electronic device in which two circuit substrates are connected with a multilayer flexible printed circuit board, but the members connected by the multilayer flexible printed circuit board are not limited to circuit substrates, and the multilayer flexible printed circuit board can be used to connect a circuit substrate and an electronic member such as a disk drive, memory device or display panel.

Also, in the present embodiment, a metal housing is used as the main body portion, but the housing itself in which the multilayer flexible printed circuit board is housed is not necessarily made of a metal, and it is also possible to use, as the main body portion, a housing made of a non-conductive material such as resin and having an inner surface provided with a conductive coating film that is used as the ground potential.

Furthermore, in the present embodiment, as the multilayer flexible printed circuit board, a multilayer flexible printed circuit board having only one signal wiring layer in addition to a ground layer is used, but it is also possible to form a protruding portion in a multilayer flexible printed circuit board including two or more signal wiring layers that is recently gaining popularity in use, and ground the ground layer.

Also, a notebook computer is used as the electronic device, but this is merely an example. As the electronic device, it is possible to use various types of portable devices such as a PDA, a portable DVD player, an electronic dictionary, a game console and a mobile phone, as well as various types of stationary electronic devices such as a computer display and a TV receiver.

The multilayer flexible printed circuit board disclosed in the present application can provide a high shielding effect for the signals transmitted via the signal wiring, and thus is useful for connecting circuit substrates, or for connecting a circuit substrate and an electronic device. Also, the electronic device using the multilayer flexible printed circuit board disclosed in the present application is useful as a highly reliable device in which the influence of noise on the signals transmitted within the device is small, and can be used in various applications such as a portable device and a stationary device.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic device, comprising:
    a housing having an inner surface, wherein at least a portion of the inner surface is conductive; and
    a multilayer flexible printed circuit board comprising:
        a ground layer, an insulating layer, and a signal wiring layer in which signal wiring is formed, wherein the ground layer, the insulating layer, and the signal wiring layer are laminated in sequence, and
        a protruding portion protruding laterally, a ground that is electrically continuous to the ground layer is formed on at least one surface of the protruding portion, and the ground is electrically connected to the conductive portion of the housing, wherein the multilayer flexible printed circuit board is attached to the inner surface of the housing with a conductive tape, and the ground and the conductive portion of the housing are covered with an adhesive side of the conductive tape.

2. The electronic device according to claim 1, wherein a portion of a backside of the ground of the multilayer flexible printed circuit board is covered with an insulating material, and the portion covered with the insulating material is fixedly attached to the inner surface of the housing due to the multilayer flexible printed circuit board being attached to the inner surface of the housing with the conductive tape.

3. The electronic device according to claim 1, wherein the ground covered with the conductive tape and the conductive portion of the housing covered with the conductive tape face the same direction.

* * * * *